(12) United States Patent
Yatim et al.

(10) Patent No.: US 12,280,563 B2
(45) Date of Patent: Apr. 22, 2025

(54) LAMINATED GLASS PANE AND METHOD FOR THE PRODUCTION THEREOF

(71) Applicant: SAINT-GOBAIN GLASS FRANCE, Courbevoie (FR)

(72) Inventors: Alexandra Yatim, Aachen (DE); Patrick Weber, Alsdorf (DE); Sara Borhani Haghighi, Aachen (DE)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 726 days.

(21) Appl. No.: 17/424,380

(22) PCT Filed: Jan. 17, 2020

(86) PCT No.: PCT/EP2020/051162
§ 371 (c)(1),
(2) Date: Jul. 20, 2021

(87) PCT Pub. No.: WO2020/152057
PCT Pub. Date: Jul. 30, 2020

(65) Prior Publication Data
US 2022/0123084 A1 Apr. 21, 2022

(30) Foreign Application Priority Data
Jan. 21, 2019 (EP) .................................... 19152806

(51) Int. Cl.
*B32B 17/10* (2006.01)
*B32B 17/06* (2006.01)
(Continued)

(52) U.S. Cl.
CPC ...... *B32B 17/10036* (2013.01); *B32B 17/061* (2013.01); *B32B 17/10165* (2013.01);
(Continued)

(58) Field of Classification Search
CPC ............ B32B 17/10036; B32B 17/061; B32B 17/10165; B32B 17/10174;
(Continued)

(56) References Cited

U.S. PATENT DOCUMENTS

2006/0152137 A1 7/2006 Beteille et al.
2007/0011863 A1 1/2007 Yoshikawa et al.
2010/0179725 A1 7/2010 Boote et al.

FOREIGN PATENT DOCUMENTS

CN 101687392 A 3/2010
CN 106226929 A 12/2016
(Continued)

OTHER PUBLICATIONS

International Search Report as issued in International Patent Application No. PCT/EP2020/051162, dated Mar. 24, 2020.
FR First Office Action as issued in Chinese Patent Application No. 202080000885.9, dated Jun. 29, 2022.

*Primary Examiner* — Ruiyun Zhang
(74) *Attorney, Agent, or Firm* — Pillsbury Winthrop Shaw Pittman LLP

(57) ABSTRACT

A laminated glass pane includes an outer glass pane and an inner glass pane, which are firmly connected to each other by a thermoplastic intermediate layer, wherein the intermediate layer includes at least one first electric functional element and at least one second electric functional element, wherein at least one metallic protective layer is arranged between the two electric functional elements, wherein the at least one first electric functional element is a display and/or the at least one second electric functional element is a PDLC film and/or a light source.

19 Claims, 3 Drawing Sheets

Figure 1:
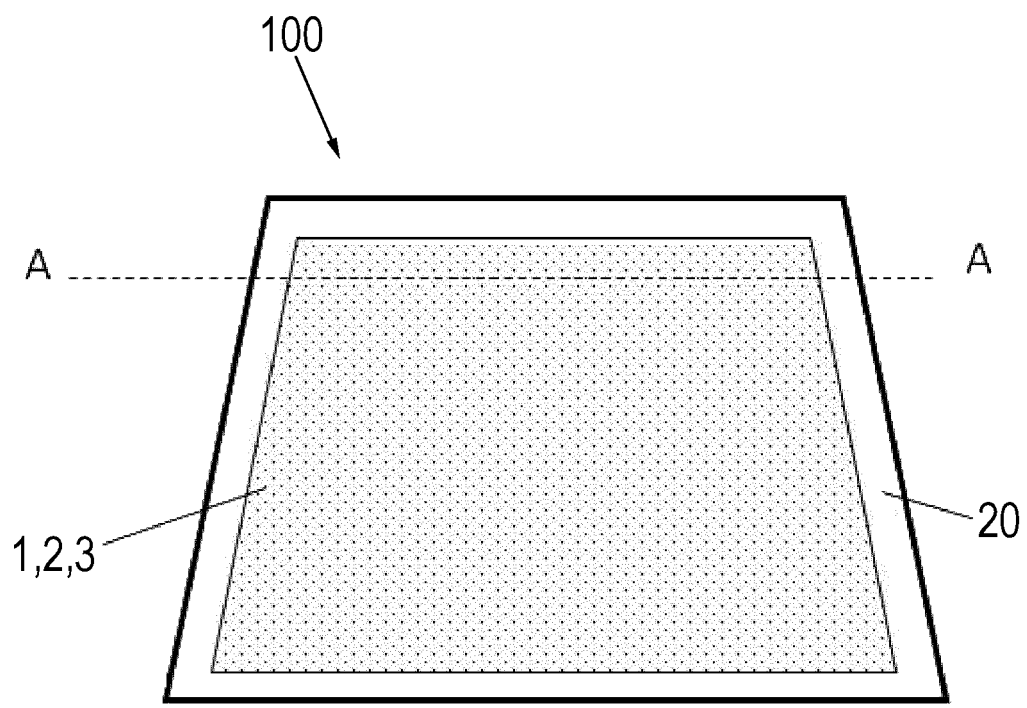

(51) Int. Cl.
  *H10K 59/126*  (2023.01)
  *H10K 59/131*  (2023.01)
  *H10K 59/50*   (2023.01)
  *H10K 71/00*   (2023.01)
  *H10K 59/12*   (2023.01)

(52) U.S. Cl.
  CPC .. *B32B 17/10174* (2013.01); *B32B 17/10293* (2013.01); *B32B 17/10532* (2013.01); *B32B 17/10541* (2013.01); *B32B 17/1055* (2013.01); *B32B 17/10761* (2013.01); *B32B 17/10788* (2013.01); *B32B 17/10816* (2013.01); *H10K 59/126* (2023.02); *H10K 59/131* (2023.02); *H10K 59/50* (2023.02); *H10K 71/00* (2023.02); *B32B 2307/412* (2013.01); *B32B 2457/206* (2013.01); *H10K 59/1201* (2023.02)

(58) Field of Classification Search
  CPC ........ B32B 17/10532; B32B 17/10541; B32B 17/1055; B32B 2307/412; B32B 2457/206; H10K 71/00; H10K 59/126; H10K 59/50
  USPC .......................................................... 428/1.1
  See application file for complete search history.

(56) References Cited

FOREIGN PATENT DOCUMENTS

| | | | |
|---|---|---|---|
| CN | 107980024 | A | 5/2018 |
| CN | 108271429 | A | 7/2018 |
| EP | 3 117 991 | A1 | 1/2017 |

LAMINATED GLASS PANE AND METHOD FOR THE PRODUCTION THEREOF

CROSS-REFERENCE TO RELATED APPLICATIONS

This application is the U.S. National Stage of PCT/EP2020/051162, filed Jan. 17, 2020, which in turn claims priority to European patent application number 19 152 806.6 filed Jan. 21, 2019. The content of these applications are incorporated herein by reference in their entireties.

The invention relates to a laminated pane having at least two electrical functional elements, a method for producing the laminated pane and its use.

Laminated panes usually consist of an outer pane and an inner pane, which are firmly bonded together by a thermoplastic intermediate layer under heat and pressure. The intermediate layer is usually made of thermoplastics such as polyvinyl butyral (PVB) or ethylene vinyl acetate (EVA).

Modern vehicle glazing is increasingly being equipped with actively controllable electrical functional elements that display information, serve as illuminants or change the optical transparency of the panes, for example OLED displays (Organic Light Emitting Diodes), OLED lighting or PDLC (Polymer Dispersed Liquid Crystal) films. Due to the reduced space requirement alone, it is desirable to integrate the electrical functional elements into the laminated pane by lamination. If multiple electrical functional elements are used in the same laminated pane, interference effects can occur if there is no electromagnetic compatibility and the functional elements are closely spaced. For example, as noted by the inventors, when an OLED display and a PDLC film are integrated in the same composite pane, interfering flickering of the image of the OLED display can be caused. Field-bound interference is believed to be caused primarily by low-frequency electromagnetic interference fields generated by functional elements operated with alternating current at a low frequency in the range of, for example, 50 to 60 Hz, such as PDLC films or OLED lightings. These low-frequency electromagnetic interference fields are coupled into the electrical connection line of the OLED display, which is usually designed as a flat ribbon conductor, since laminated flat ribbon conductors are poorly insulated against electromagnetic interference fields.

Up to now, electromagnetic compatibility problems have been solved by using various electrical components such as coils, capacitors or magnetic cores to eliminate the interference at the source. However, such components cannot be laminated in the laminated pane.

EP 3117991 A1 shows a laminated glazing with an IR-reflective coating, which serves to protect electrical structures such as capacitive sensors.

US 2010/179725 A1 shows a laminated glazing with a shield made of a metal film, which shields LEDs from a switching area.

Accordingly, the object of the present invention is to provide a laminated pane which is improved compared to the prior art and has at least two electrical functional elements laminated into the laminated pane, in which electromagnetic compatibility problems are significantly reduced or completely avoided without having to resort to externally connected electrical components for this purpose. In addition, the laminated pane should be easy and inexpensive to manufacture in industrial series production.

According to the proposal of the invention, these and further objects are solved by a laminated pane according to the independent patent claim. Advantageous embodiments of the invention result from the subclaims.

According to the invention, a laminated pane is shown which comprises at least one outer pane and one inner pane which are firmly connected to one another by a thermoplastic intermediate layer. When laminating the laminated pane according to the invention, a stacking sequence comprising an outer pane, an inner pane and an intermediate layer stack of a plurality of individual layers is laminated, the thermoplastic intermediate layer being produced by lamination of the layer stack. Accordingly, the term "intermediate layer" refers to an overall layer produced by lamination of several different individual layers. In particular, the thermoplastic intermediate layer may comprise different thermoplastic materials based on multiple individual layers of thermoplastic materials.

The thermoplastic intermediate layer includes at least one first (active) electrical functional element and at least one second (active) electrical functional element, which are thus laminated in the laminated pane. In general, respective electrical connection lines of the electrical functional elements are also (partially) laminated in the laminated pane. This applies in particular to the at least one first electrical functional element. In particular, the electrical connection line of the first electrical functional element is a flat ribbon conductor (partially) laminated in the laminated pane.

Preferably, the at least one first electrical functional element is embedded in a separate single layer of thermoplastic material, which surrounds the first electrical functional element in a frame-like manner. This separate single layer of thermoplastic material compensates for the difference in height inside the laminated pane caused by the first electrical functional element and ensures a low-stress connection free of optical distortions after lamination.

Similarly, the at least one second electrical functional element is preferably embedded in a separate single layer of thermoplastic material which surrounds the second electrical functional element in the form of a frame. This separate single layer of thermoplastic material compensates for the difference in height inside the laminated pane caused by the second electrical functional element and ensures a low-stress connection free of optical distortions after lamination. Accordingly, the two electrical functional elements are contained in different individual layers and are spaced apart in the direction of the stacking sequence.

For the purposes of the present invention, an "electrical functional element" means an active electrical component which is controllable and to which an electrical supply or control voltage is applied. Each electrical functional element is provided with an electrical connection line which comprises a laminated part. In the sense of the invention, the laminated part of the electrical connection line of the electrical function element, which is located in the thermoplastic intermediate layer, is a component of the electrical function element. The term "connection line" refers to all electrical conductors to which the electrical function element is connected.

The first electrical function element may be supplied with a DC voltage or an AC voltage. In the laminated pane, the first electrical function element (including the laminated part of its electrical connection line) constitutes an interference sink. The first electrical functional element is, for example, a display, preferably an OLED display, particularly preferably a transparent OLED display.

In the laminated pane according to the invention, the second electrical functional element is supplied with an AC voltage, with the possibility of field-bound interference being generated that can be coupled into the interference sink, in particular through the electrical connection line of the interference sink. Typically, this is a low-frequency AC voltage, which has a frequency of at most 100 Hz, in particular at most 80 Hz, which is in the range of 50 to 60 Hz, for example. Such electromagnetic interference fields result for example, in disturbing flickering of a display, in particular an OLED display. This is particularly true if the connection line of the display comprises a laminated ribbon conductor, which can only be shielded poorly against electromagnetic interference fields. The second electrical functional element is, for example, a light source, preferably an LED light source (Light Emitting Diode) and particularly preferably an OLED light source, or a PDLC film.

It is essential that a metallic protective layer is arranged in the thermoplastic intermediate layer between the at least one first electrical functional element (including the laminated part of its connection line), in the sense of the present invention the interference sink, and the at least one second electrical functional element, in the sense of the present invention the interference source. The metallic protective layer advantageously shields the interference sink from the interference fields generated by the interference source. Complete shielding is not required here, since—as the inventors were able to show—even partial shielding of the electromagnetic interference fields can effectively prevent visual interference in a display, such as flickering. The use of separate electrical components for the purpose of interference suppression, which are non-laminated and thus arranged outside the laminated panel, can be advantageously dispensed with.

A further advantageous effect is the shielding of the at least one electrical functional element located between the metallic protective layer and the inner pane from infrared and ultraviolet radiation. Active electrical functional elements are often sensitive to heat and ultraviolet radiation. Degradation of electrical functional elements can be effectively prevented.

In an advantageous embodiment of the laminated pane according to the invention, the metallic protective layer is transparent to electromagnetic radiation visible to the human eye. A metallic protective layer is transparent in the sense of the invention if it has a transmission in the visible spectral range of greater than 70%, preferably greater than 80%, more preferably greater than 90%. Hereby, on the one hand, the advantageous effect with regard to at least partial shielding of the interference sink from interference fields can be achieved. On the other hand, the view through the laminated pane is not impaired.

In a further advantageous embodiment of the laminated pane according to the invention, the metallic protective layer comprises or consists of at least one metal layer, preferably an aluminum layer, a stainless steel layer, a copper layer, a silver layer or a gold layer. Such metal layers are particularly suitable for shielding electromagnetic interference fields. In addition, they are capable of sufficiently absorbing or reflecting infrared or ultraviolet radiation. An aluminum layer is particularly advantageous here because of its good thermal conductivity and low UV transmission.

In a further advantageous embodiment of the protective layer according to the invention, the at least one metal layer is arranged on at least one carrier film. The carrier film preferably comprises or consists of a polymer film and in particular polyethylene terephthalate (PET), polyvinyl butyral (PVB) (for example Mowital), ethylene vinyl acetate (EVA), polyethylene naphthalate (PEN), polyepoxide or polyimide. By arranging a metal layer on a carrier film, thin and brittle metal layers can also be processed well.

In a further advantageous embodiment of the protective layer according to the invention, the protective layer comprises or consists of at least one metal foil. The metal foil is preferably self-supporting, that is, sufficiently thick and stable to be inserted and processed without an additional carrier foil. Preferred metal foils are aluminum foils, stainless steel foils, copper foils, silver foils or gold foils. It is understood that several metal foils can also be combined with each other, for example to achieve optimized opacity to infrared and ultraviolet radiation.

In a further advantageous embodiment, the metal layer has a thickness of from 0.5 µm to 500 µm, preferably from 1 µm to 200 µm, in particular from 20 µm to 50 µm. Such thick metal layers can shield electromagnetic interference fields well and exhibit sufficiently good impermeability to infrared and/or ultraviolet radiation. Furthermore, such metal layers are inexpensive and easy to process.

The metallic protective layer can be inserted and laminated into the stacking sequence of the laminated pane in the form of a coated carrier foil or metal foil.

In an embodiment of the laminated pane according to the invention, each electrical functional element is arranged in sections between the outer pane and the inner pane. Sectionally means here that the electrical function element in the orthogonal projection onto the outer or inner pane (perpendicular view in the direction of the stacking sequence onto the outer or inner pane, respectively) does not cover the full area of the outer pane or inner pane, but only a partial area, such as a narrow band-shaped strip.

Accordingly, according to an embodiment of the laminated pane according to the invention, the metallic protective layer is arranged only in sections between the outer pane and the inner pane. Sectionally means here that the metallic protective layer in the orthogonal projection onto the outer or inner pane (perpendicular view in the direction of the stacking sequence onto the outer or inner pane, respectively) does not cover the full area of the outer pane or the inner pane, but only a partial area, such as a narrow band-shaped strip.

If the at least one first electrical function element is located between the metallic protective layer and the outer pane (case I), it is preferred according to the invention if a region of the orthogonal projection of the at least one first electrical function element (including the laminated part of its electrical connection line) onto the outer pane is located entirely in the region of the orthogonal projection of the metallic protective layer onto the outer pane.

If the at least one first electrical functional element is located between the metallic protective layer and the inner pane (case II), it is preferred according to the invention if a region of the orthogonal projection of the at least one first electrical functional element (including the laminated part of its electrical connection line) onto the inner pane is arranged entirely in the region of the orthogonal projection of the metallic protective layer onto the inner pane.

The orthogonal projection of the metallic protective layer onto the outer or inner pane results from a perpendicular view through the metallic protective layer (perpendicular to the plane of the metallic protective layer, i.e. in the direction of the stacking sequence). Hereby, a good shielding of the interference sink from electromagnetic interference radiation can be achieved.

Particularly preferably, the area of the orthogonal projection of the metallic protective layer onto the outer or inner pane is at least 90%, in particular 100%, of the area of the plane of the thermoplastic intermediate layer containing the at least one first electrical function element. The plane of the thermoplastic intermediate layer containing the at least one first electrical functional element is parallel to the outer or inner pane. This makes it possible to achieve particularly effective shielding of the interference sink from electromagnetic interference fields.

In a particularly advantageous embodiment of the laminated pane according to the invention, the thermoplastic intermediate layer between the at least one first electrical functional element and the at least one second electrical functional element has a thicker individual layer made of a thermoplastic material, which serves as a "spacer" or spacer for spacing the at least one first electrical functional element and the at least one second electrical functional element. Advantageously, a film of thermoplastic material having a thickness of at least 0.1 mm, preferably at least 0.30 mm, is inserted into the stacking sequence of the thermoplastic layer before lamination for this purpose. This can advantageously weaken the effect of the electromagnetic interference fields generated by the interference source by increasing the distance to the interference sink.

Basically all electrically insulating substrates which are thermally and chemically stable as well as dimensionally stable under the conditions of manufacture and use of the laminated pane according to the invention are suitable as outer pane and inner pane.

The panes preferably contain or consist of glass, particularly preferably flat glass, most preferably float glass, such as soda-lime glass, borosilicate glass or quartz glass. Alternatively, the panes may contain or consist of clear plastics, preferably rigid clear plastics, in particular polyethylene, polypropylene, polycarbonate, polymethyl methacrylate, polystyrene, polyamide, polyester, polyvinyl chloride and/or mixtures thereof. The panes are preferably transparent, particularly for use of the panes as windshields or rear windows of a vehicle or other uses where high light transmission is desired. Transparent in the sense of the invention is then understood to be a pane which has a transmission in the visible spectral range of greater than 70%. However, for panes that are not in the driver's field of vision relevant to traffic, for example roof panes, the transmission can also be much lower, for example greater than 5%.

The thickness of the panes can vary widely and thus be adapted to the requirements of the individual case. Preferably, standard thicknesses of the individual panes of 1.0 mm to 25 mm, preferably 1.4 mm to 2.5 mm for vehicle glass and preferably 4 mm to 25 mm for furniture, appliances and buildings, in particular for electric radiators, are used. The size of the panes can vary widely and depends on the size of the use according to the invention. For example, the first pane and second pane have areas ranging from 200 $cm^2$ to 20 $m^2$, which are common in the automotive and architectural fields.

The laminated pane may have any three-dimensional shape. Preferably, the three-dimensional shape has no shadow zones, so that it can be coated, for example, by cathodic sputtering, for example with a planar infrared reflective coating or a low-E coating. Preferably, the panes are planar or slightly or strongly curved in one direction or in several directions of space. In particular, planar substrates are used. The panes may be colorless or colored.

The thermoplastic interlayer contains at least one plastic, preferably polyvinyl butyral (PVB), ethylene vinyl acetate (EVA), and/or polyethylene terephthalate (PET). However, the intermediate layer may also contain, for example, polyurethane (PU), polypropylene (PP), polyacrylate, polyethylene (PE), polycarbonate (PC), polymethyl metacrylate, polyvinyl chloride, polyacetate resin, casting resins, acrylates, fluorinated ethylene propylenes, polyvinyl fluoride and/or ethylene tetrafluoroethylene, or copolymers or mixtures thereof. The thermoplastic interlayer can be formed by one or also by several superimposed films, the thickness of a film preferably being from 0.025 mm to 1 mm, typically 0.38 mm or 0.76 mm. The individual layers of the thermoplastic interlayers may be thermoplastic and may adhere to each other after lamination of the sheets.

The terms "outer pane" and "inner pane" are chosen merely to distinguish the two panes in a laminated pane according to the invention. No statement about the geometrical arrangement is associated with the terms. For example, if the laminated pane according to the invention is intended to separate the interior space from the exterior environment in an opening, for example of a vehicle or a building, the outer pane usually faces the exterior environment, whereas the inner pane faces the interior space.

According to an embodiment of the invention, the thermoplastic intermediate layer comprises, at least before lamination, one or more of the following features:

a single layer of a thermoplastic material, which contains the at least one first electrical functional element, in particular surrounds it in the form of a frame;

a single layer of a thermoplastic material which contains the at least one second electrical functional element, in particular surrounds it in the form of a frame, the single layer containing the second electrical functional element being different from the single layer containing the first electrical functional element;

a single layer made of a thermoplastic material, which contains a connection line, in particular a flat ribbon conductor, guided laterally out of the laminated pane, the connection line being electrically connected to the at least one first electrical functional element, and the single layer made of a thermoplastic material being different from the single layers containing the first and second electrical functional elements, respectively between the two electrical functional elements, at least one metallic protective layer, which is preferably transparent to visible light;

on both sides of the metallic protective layer, preferably on both sides of a metallic foil forming the metallic protective layer or of a carrier foil with a metallic protective layer, in each case a single layer of a thermoplastic material; the single layer of a thermoplastic material located between the metallic protective layer and the interference sink is preferably thick, with a layer thickness of at least 0.1 mm, preferably at least 0.3 mm, in order to achieve a greater distance between the interference sink and the interference source immediately adjacent to the inner pane, an optional single layer of a thermoplastic material;

immediately adjacent to the outer pane, an optional single layer of a thermoplastic material.

The thermoplastic materials of the individual layers may be the same or different from each other. In particular, the intermediate layer can be formed by several films arranged one above the other in terms of area or sections. If individual layers consist of the sane materials, they may no longer be customizable after lamination.

The invention further extends to a method of producing a laminated pane according to the invention as described above, which comprises the following steps:

(a) producing a stack sequence comprising an outer pane, a thermoplastic intermediate layer containing several different individual layers, and an inner pane, (b) laminating the stacking sequence to form a laminated pane.

The bonding of the stacking sequence in process step (b) is preferably carried out under the action of heat, vacuum and/or pressure. Processes known per se can be used to produce a laminated pane.

For example, so-called autoclave processes can be carried out at an elevated pressure of about 10 bar to 15 bar and temperatures of 130° C. to 145° C. for about 2 hours. Vacuum bag or vacuum ring processes known per se operate, for example, at about 200 mbar and 80° C. to 110° C. The outer pane, the thermoplastic intermediate layer and the inner pane can also be pressed in a calender between at least one pair of rolls to form a pane. Plants of this type are known for the production of panes and usually have at least one heating tunnel upstream of a pressing unit. The temperature during the pressing process ranges, for example, from 40° C. to 150° C. Combinations of calendering and autoclaving processes have proved particularly effective in practice. Alternatively, vacuum laminators can be used. These consist of one or more chambers which can be heated and evacuated, in which the sheets are laminated within, for example, about 60 minutes at reduced pressures of 0.01 mbar to 800 mbar and temperatures of 80° C. to 170° C.

Furthermore, the invention extends to the use of the laminated pane according to the invention in buildings, in particular in the access area, window area, roof area or façade area, as a built-in part in furniture and appliances, in means of transport for traffic on land, in the air or on water, in particular in trains, ships and motor vehicles, for example as a windshield, rear window, side window and/or roof window.

The various embodiments of the invention may be implemented individually or in any combination. In particular, the features mentioned above and to be explained below can be used not only in the combinations indicated, but also in other combinations or alone, without leaving the scope of the present invention.

Figure 2:
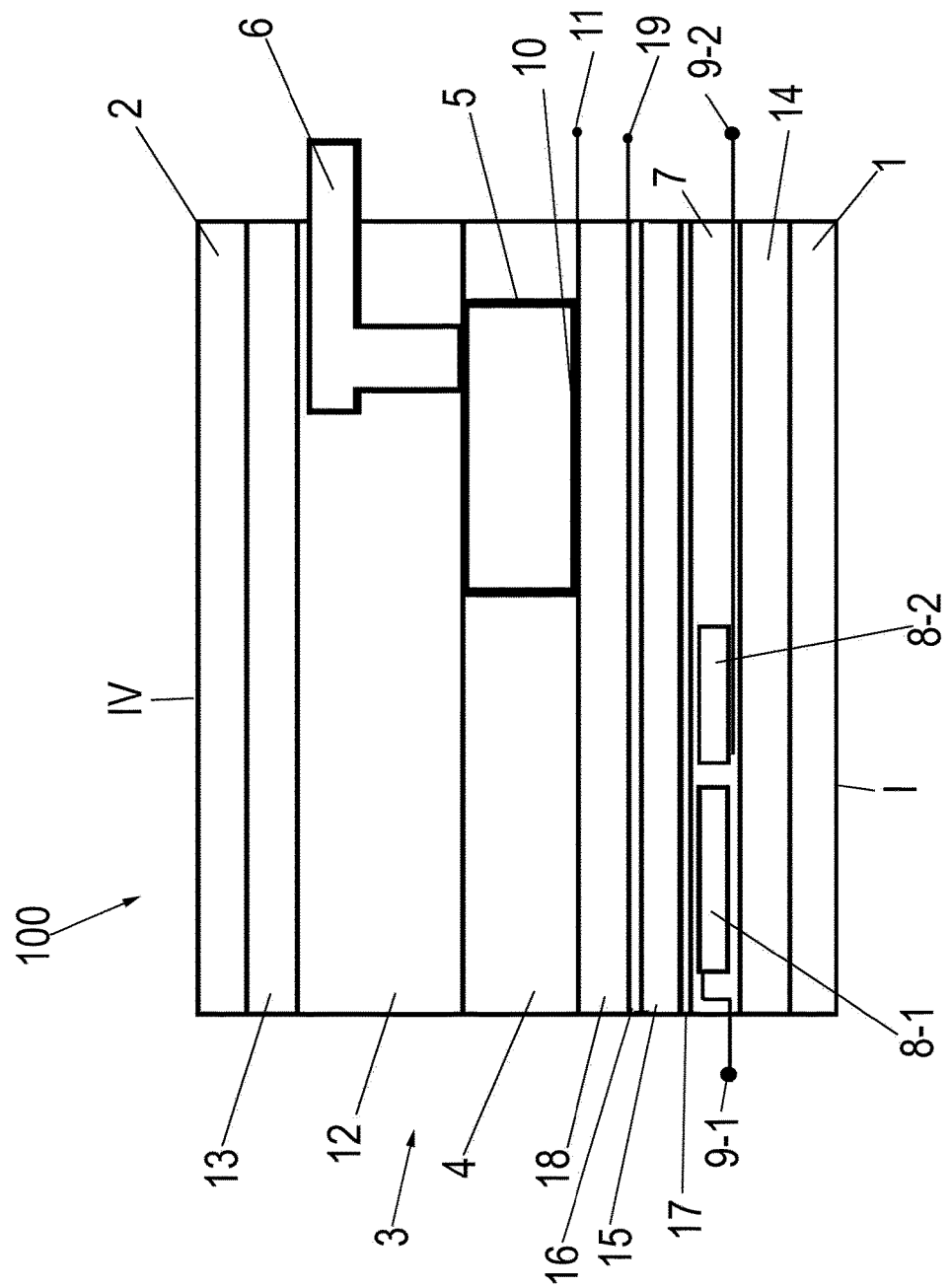
Figure 3:
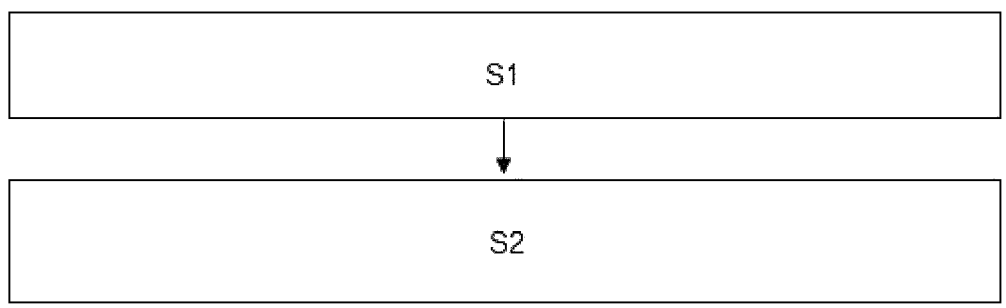

The invention is explained in more detail below by means of an exemplary embodiment, reference being made to the accompanying figures. They show in simplified, not to scale representation:

FIG. 1 a top view of an embodiment of the laminated pane according to the invention, FIG. 2 a cross-sectional view of the laminated pane along the line of intersection A-A of FIG. 1, FIG. 3 a detailed flow diagram of an embodiment of the method for producing the laminated pane according to the invention.

DETAILED DESCRIPTION OF THE DRAWINGS

FIG. 1 shows a top view of an exemplary embodiment of a laminated pane 100 according to the invention with laminated electrical functional elements. The laminated pane 100 serves here, for example, as a vehicle pane, in particular as a windshield of a passenger car. In accordance with the typical shape of windshields, the laminated pane 100 is, for example, substantially trapezoidal. The dimensions of the laminated pane 100 are, for example, 0.9 m×1.5 m on its long sides. In general, the laminated pane 100 with a corresponding shape can also be used in other applications, for example as construction glazing, furniture glazing or the like. It is also conceivable that the laminated pane 100 is part of an insulating glazing system and is arranged, for example, in a window of a building. Alternatively, the laminated pane 100 may be arranged in an interior space and may be, for example, glazing of a meeting room or a refrigerator or piece of furniture.

FIG. 2 shows a cross-sectional view of the laminated pane 100 along the line of intersection A-A of FIG. 1. The laminated pane 100 comprises an outer pane 1 and an inner pane 2, which are fixedly bonded to each other via a thermoplastic intermediate layer denoted overall by the reference numeral 3. The thermoplastic intermediate layer 3 is composed of a plurality of individual layers which are arranged one above or one below the other and are each formed over the entire surface, i.e. in vertical projection (vertical view in stacking sequence) onto the outer pane 1 or inner pane 2 all the individual layers have the same surface area. The thermoplastic intermediate layer 3 extends over the complete area between outer pane 1 and inner pane 3.

The inner pane 2 is intended to face the interior of a vehicle in the installed position. In other words, the outside surface IV of the inner pane 2 is accessible from the interior, whereas the outside surface I of the outer pane 1 faces outward with respect to the vehicle interior. The terms inside and outside refer respectively to the inside and outside of the laminated pane 100. The outside pane 1 and the inside pane 2 are each made of glass, in this case for example soda-lime glass. The thickness of inner pane 2 is, for example, 1.6 mm and the thickness of outer pane 1 is, for example, 2.1 mm. It is understood that outer pane 1 and inner pane 2 may also be made of a different glass material, may have any thicknesses, and may also be formed, for example, of the sane thickness.

The individual components of the laminated pane 100, in particular the electrical functional elements arranged within the thermoplastic intermediate layer 3, can be clearly seen in the sectional view of FIG. 2. The thermoplastic intermediate layer 3 comprises a plurality of layers each comprising thermoplastic material, in this case for example PVB. For ease of reference, these layers are referred to hereinafter in simplified form as "PVB layers". The PVB layers may include various compositions of PVB. It is understood that instead of PVB, the PVB layers may include a thermoplastic material other than PVB suitable for laminating the outer pane 1 and inner pane 2.

The composite pane 100 includes a plurality of electrical functional elements disposed in different PVB layers of the layer stack 3. The electrical functional elements are each applied with control signals and a supply voltage.

In a first PVB layer 4, a first electrical functional element is arranged, which here is for example an OLED display 5. The OLED display 5 is provided with a connection line, hereinafter referred to as "OLED display connection line 6", for transmitting control signals and for supplying voltage. The OLED display connection line 6 is designed here as a ribbon conductor. The OLED display 5 is operated with an alternating voltage.

At least one second electrical functional element is arranged in a second PVB layer 7, which is operated with a low-frequency alternating voltage in the range of at most 60 Hz, for example 50 to 60 Hz. In the present exemplary embodiment, two second electrical functional elements are shown, namely a PDLC film 8-1 and an OLED lighting 8-2, one or both of which may be arranged in the composite pane 100. The PDLC film 8-1 is electrically connected to an electrical connection line, hereinafter referred to as "PDLC film connection line 9-1", for transmitting control signals and for supplying power. Similarly, the OLED lighting 8-2 is electrically connected to an electrical connection line, further referred to as "OLED lighting connection line 9-2", for transmitting control signals and for supplying power. The two second electrical functional elements 8-1, 8-2 are included here, for example, in a same PVB layer, although they may equally be arranged in PVB layers that are different from each other.

The OLED display 5 is embedded in the first PVB layer 4, which surrounds the OLED display 5 in a frame-like manner. The first PVB layer 4 is transparent and has, for example, a thickness of 0.51 mm, which corresponds at least to the thickness of the OLED display 5 and enables the OLED display 5 to be laminated within the first PVB layer 4 with a precise fit. The OLED display 5 is passively grounded at its rear side 10. It has an optionally usable electrical ground connection, further referred to as "OLED display ground connection 11", through which active grounding of the OLED display 5 is possible. The OLED display ground connection 10 is led out of the side of the laminated pane 100.

The two second electrical functional elements 8-1, 8-2 are embedded in the second PVB layer 7 in a side-by-side manner, the second PVB layer 7 surrounding the two second electrical functional elements 8-1, 8-2 in a frame-like manner, respectively. Alternatively, only one second electrical functional element is present, which is surrounded by the second PVB layer 7 in a frame-like manner. The second PVB layer 7 is transparent and has, for example, a thickness of 0.38 mm, which is at least equal to the thickness of the PDLC film 8-1 and the thickness of the OLED lighting 8-2, so that the two second electrical function elements 8-1, 8-2 can be laminated in the second PVB layer 7 with a snug fit. The PDLC film 8-1 has an electrical connection line, hereinafter referred to as the "PDLC film connection line 9-1", for transmitting control signals and supplying power. Similarly, the OLED lighting 8-2 has an electrical connection line, further referred to as "OLED lighting connection line 9-2", for transmitting control signals and power supply. The PDLC film connection line 9-1 and the OLED lighting connection line 9-2 each extend laterally from the laminated pane 100.

Immediately adjacent to the first PVB layer 4 and disposed between the first PVB layer 4 and the inner pane 2, a third PVB layer 12 is provided. The OLED display connection cable 6 is embedded in the third PVB layer 12 and extends laterally out of the composite pane 100. The third PVB layer 12 is transparent and has a thickness of 0.84 mm, for example, which corresponds to at least the dimension of the OLED display connection cable 6 along the stacking sequence of the layer stack 3, so that the OLED display connection cable 6 can be laminated in the third PVB layer 12 with a precise fit. Immediately adjacent to the inner pane 2 and disposed between the third PVB layer 14 and the inner pane 2, a fourth PVB layer 13 is provided. Immediately adjacent to the outer pane 1 and disposed between the second PVB layer 7 and the outer pane 1, a fifth PVB layer 14 is provided. The fourth PVB layer 13 and the fifth PVB layer 14 are each transparent and each has a thickness of 0.38 mm, for example. The fourth PVB layer 13 and the fifth PVB layer 14 meet the legal requirements for laminated panes with regard to break resistance and splinter bonding. In the event of breakage, the resulting glass splinters adhere to these PVB layers and cannot enter the interior of the vehicle, where any glass splinters could cause serious injuries. The fourth PVB layer 13 and the fifth PVB layer 14 can be dispensed with if the total area of the electrical functional elements is relatively low in relation to the total glass area (maximum 5% of the total glass area) and the electrical functional elements are not arranged at the edge (more than 1 cm from the edge). The fourth PVB layer 13 also serves as a connecting layer between the OLED display connection line 6 and the inner pane 2. Similarly, the fifth PVB layer 14 also serves as a connecting layer between the PDLC film connection line 9-1 and the OLED lighting connection line 9-2 and the outer pane 1.

Between the first PVB layer 4 containing the OLED display 5 and the second PVB layer 7 containing the PDLC film 8-1 and/or the OLED lighting 8-2 there is a PET film 15 which is coated on one side, here for example the side facing the inner pane 2, with a metallic protective layer 16 made of a metallic material. Immediately adjacent to the metallic protective layer 16 and between the metallic layer 16 and the first PVB layer 4 is a sixth PVB layer 18, which is constructed analogously to the fourth PVB layer 13 or fifth PVB layer 14. Immediately adjacent to the PET film 15 and between the PET film 15 and the second PVB layer 7 is a seventh PVB layer 17, which is transparent and, for example, 0.05 mm thick. The sixth PVB layer 18 and the seventh PVB layer 17 each serve to laminate both sides of the PET film 15 with the metallic protective layer 16 applied thereto. When viewed perpendicularly through the stacking sequence, the metallic protective layer 16 extends over the entire dimension of both the first PVB layer 4 containing the OLED display 5 and the second PVB layer 7 containing the PDLC film 8-1 and the OLED illumination 8-2. Alternatively, it would be possible for the metallic protective layer 16 to extend over a smaller area, although in view of the function described below, it is preferred for the metallic protective layer 16 to extend over at least an area that is 90% of the area of the first PVB layer 4 containing the OLED display 5. The metallic protective layer 16 applied to the PET film 15 is electrically conductive, transparent and has a thickness of 0.05 mm, for example. Basically all electrically conductive metals can be considered as materials for the metallic protective layer 16, such as aluminum, stainless steel, copper or gold, in particular silver. Preferably, the metallic protective layer 16 is transparent to visible light.

The metallic protective layer 16 is passively grounded, but can optionally also be actively grounded. For this purpose, the metallic protective layer 16 has a protective layer ground terminal 19. The protective layer ground terminal 19 is preferably electrically connected to the rear OLED display ground terminal 11.

In the laminated panel 100, the PDLC film 8-1 and the OLED lighting 8-2 are typically operated with a low-frequency AC voltage having a frequency in the range of, for example, 50 to 60 Hz and an AC voltage in the range of 36 to 100 V, respectively. This generates low-frequency electromagnetic interference fields that can be coupled into the OLED display 5 via the OLED display connection cable 6, where they generate flickering of the display that is perceived as annoying by the viewer. The PDLC film 8-1 and the OLED illumination 8-2 thus represent low-frequency electromagnetic interference sources. The OLED display 5 is an interference sink that is coupled to the interference sources primarily via the OLED display connection cable 6.

The metallic protective layer 16 located between the two interference sources and the OLED display 5 can shield the OLED display 5 from the electromagnetic interference fields, at least to the greatest extent possible, so that unpleasant flickering or other interference to the OLED display 5 is reduced or completely avoided. If necessary, the metallic protective layer 16 can already achieve this task without being connected to electrical ground. If the metallic protective layer 16 is actively grounded, for example by electrically connecting the rear OLED display ground terminal 11 and the protective layer ground terminal 19, the shielding from electromagnetic interference fields can be further improved.

In this regard, it is also advantageous to increase the distance between the interference sources and the interference sink. Increasing the distance between the two second electrical functional elements (PDLC film 8-1 and OLED lighting 8-2) and the first electrical functional element (OLED display 5) can be achieved in a simple manner by the relatively thick seventh PVB layer 18 (here, for example, 0.38 mm). This measure can further improve the shielding of the OLED display 5 from electromagnetic interference fields generated by the PDLC film 8-1 and OLED lighting 8-2.

Another advantage of the metallic protective layer 16 is a protection of the OLED display 5 from heating caused by infrared radiation and ultraviolet radiation, since infrared and ultraviolet components of solar radiation can be largely reflected by the metallic protective layer 16. In addition, the energy input into the vehicle interior can be reduced.

The outer pane 1, the inner pane 2 and the various layers of the thermoplastic protective layer 3 can be permanently bonded to one another in a laminating process when the laminated pane 100 is manufactured.

In FIG. 1, an edge cover 20 is additionally shown, which is formed, for example, in the form of a black print.

A specific manufacturing process for producing the laminated pane 100 described above is shown in the flow diagram of FIG. 3. It comprises the following process steps S1-S2:

S1: providing a stack sequence comprising.
an outer pane 1,
optionally a fourth PVB layer 13
a third PVB layer 12, in which an OLED display connection line 6 is embedded
a first PVB layer 4, which is arranged in the shape of a frame around an OLED display 5
a seventh PVB layer 18,
a PET film 15 with a metallic protective layer 16,
a sixth PVB layer 17
a second PVB layer 7 arranged in a frame shape around the PDLC film 8-1 and/or OLED lighting 8-2
a metallic protective layer 18 between the first PVB layer 4 and the second PVB layer;
a second PVB layer 7 arranged in a frame shape around a PDLC film 8-1 and/or around an OLED lighting 8-1;
optionally, a fifth PVB layer 14,
an inner pane 2
S2: laminating the stacking sequence to form a laminated pane 100.

The present invention provides an improved laminated pane with integrated electrical functional elements, in which an interference sink formed by a first electrical functional element is shielded by a protective metallic layer from field-bound interference generated by at least a second electrical functional element (interference source). Complex electrical components outside the laminated pane can be dispensed with.

LIST OF REFERENCE SIGNS 1 outer pane
2 inner pane
3 intermediate layer
4 first PVB layer
5 OLED display
6 OLED display connection line
7 second PVB layer
8-1 PDLC film
8-2 OLED lighting
9-1 PDLC film connection line
9-2 OLED lighting connection cable
10 OLED display backside 5
11 OLED display ground connection
12 Third PVB layer
13 fourth PVB layer
14 fifth PVB layer
15 PET film
16 protective layer
17 sixth PVB layer
18 seventh PVB layer
19 Protective layer-mass connection
20 Covering
100 Laminated pane

The invention claimed is:

1. A laminated pane comprising:
an outer pane and an inner pane, which are firmly connected to one another by at least one thermoplastic intermediate layer, the at least one thermoplastic intermediate layer having at least one first electrical functional element and at least one second electrical functional element, the at least one second electrical functional element being adapted to be supplied by an alternating voltage, at least one metallic protective layer being arranged between the at least one first and the at least one second electrical functional elements, the at least one metallic protective layer being arranged and configured to shield the least one first electrical functional element against field-bound interference generated by the at least one second electrical functional element,
wherein the at least one first electrical functional element is an OLED display and the at least one second electrical functional element is a Polymer Dispersed Liquid Crystal film or an OLED light source, or both.

2. The laminated pane according to claim 1, wherein the at least one metallic protective layer comprises or consists of at least one metal layer.

3. The laminated pane according to claim 1, wherein the at least one metallic protective layer is arranged on a carrier film.

4. The laminated pane according to claim 1, wherein the at least one metallic protective layer comprises or consists of a metallic foil.

5. The laminated pane according to claim 1, wherein the at least one metallic protective layer has a thickness of from 0.5 µm to 500 µm.

6. The laminated pane according to claim 1, wherein
(i) if the at least one first electrical functional element is located between the at least one metallic protective layer and the outer pane, an area of an orthogonal projection of the at least one metallic protective layer onto the outer pane is at least 90% of an area of an orthogonal projection of a plane of the at least one thermoplastic intermediate layer containing the at least one first functional element onto the outer pane, or
(ii) if the at least one first electrical functional element is located between the at least one metallic protective layer and the inner pane, an area of the orthogonal projection of the at least one metallic protective layer onto the inner pane is at least 90% of an area of the orthogonal projection of a plane of the at least one thermoplastic intermediate layer containing the at least one first functional element onto the inner pane.

7. The laminated pane according to claim 1, wherein the at least one metallic protective layer is grounded.

8. The laminated pane according to claim 1, wherein a layer of thermoplastic material with a thickness of at least 0.3 mm is arranged between the at least one first electrical functional element and the at least one second electrical functional element.

9. The laminated pane according to claim 1, wherein the metallic protective layer is electrically connected to a ground terminal of the OLED display.

10. The laminated pane according to claim 1, wherein the thermoplastic intermediate layer comprises:
  a first layer of a thermoplastic material containing the at least one first electrical functional element,
  a second layer of a thermoplastic material containing the at least one second electrical function element,
  a third layer made of a thermoplastic material, which contains a connection line for the at least one first electrical functional element, which is roped out of the laminated pane.

11. The laminated pane according to claim 10, wherein the at least one metallic protective layer is applied to a carrier film, a layer of a thermoplastic material being arranged in each case on both sides of the carrier film, directly adjacent to the carrier film.

12. The laminated pane according to claim 10, wherein a fourth layer of a thermoplastic material is arranged directly adjacent to the inner pane and/or a fifth layer of a thermoplastic material is arranged directly adjacent to the outer pane.

13. A method of manufacturing a laminated pane according to claim 1, comprising:
  producing a stacking sequence of an outer pane, an inner pane and at least one thermoplastic intermediate layer, wherein the at least one thermoplastic intermediate layer comprises at least a first electrical functional element and at least a second electrical functional element, between which at least one metallic protective layer is arranged,
  laminating the stacking sequence into a composite pane.

14. A method comprising utilizing the laminated pane according to claim 1 in a transport vehicle for land, air or water or as a built-in part in furniture, appliances and buildings, or as building glazing in construction sector or architectural sector, indoors or outdoors.

15. The laminated pane according to claim 2, wherein the at least one metal layer is an aluminum layer, a stainless steel layer, a copper layer, a silver layer or a gold layer.

16. The laminated pane according to claim 3, wherein the carrier film is a polymeric carrier film which contains or consists of polyethylene terephthalate (PET), polyvinyl butyral (PVB), ethylene vinyl acetate (EVA), polyethylene naphthalate (PEN), polyepoxide or polyimide.

17. The laminated pane according to claim 4, wherein the metallic foil is an aluminum foil, a stainless steel foil, a copper foil, a silver foil or a gold foil.

18. The laminated pane according to claim 5, wherein the at least one metallic protective layer has a thickness of from 20 μm to 50 μm.

19. The laminated pane according to claim 5, wherein the at least one metallic protective layer is transparent to light visible to the human eye.

* * * * *